United States Patent [19]

Webster et al.

[11] 4,098,452

[45] Jul. 4, 1978

[54] LEAD BONDING METHOD

[75] Inventors: Harold F. Webster, Scotia; Dominic A. Cusano, Schenectady, both of N.Y.

[73] Assignee: General Electric Company, Schenectady, N.Y.

[21] Appl. No.: 730,646

[22] Filed: Oct. 7, 1976

Related U.S. Application Data

[60] Continuation-in-part of Ser. No. 563,821, Mar. 31, 1975, abandoned, and Ser. No. 697,983, Jun. 21, 1976, abandoned, which is a division of Ser. No. 563,821.

[51] Int. Cl.[2] .......................... B23K 1/20; H01L 21/58

[52] U.S. Cl. .................................... 228/123; 228/208; 228/209; 228/263

[58] Field of Search ................................ 228/122–124, 228/179, 263, 208–210; 357/71, 65

[56] References Cited

U.S. PATENT DOCUMENTS

| | | | |
|---|---|---|---|
| 2,568,242 | 9/1951 | Matteson, Jr. | 228/179 X |
| 2,686,958 | 8/1954 | Eber et al. | 228/124 |
| 2,874,341 | 2/1959 | Biondi et al. | 228/179 X |
| 2,945,285 | 7/1960 | Jacobs | 357/71 X |
| 2,996,401 | 8/1961 | Welch et al. | 228/122 X |
| 3,078,564 | 2/1963 | Bourdeau | 228/263 X |
| 3,409,467 | 11/1968 | Foley | 357/65 X |
| 3,567,508 | 3/1971 | Cox et al. | 357/71 X |

*Primary Examiner*—Al Lawrence Smith

*Assistant Examiner*—K. J. Ramsey

*Attorney, Agent, or Firm*—Marvin Snyder; Joseph T. Cohen

[57] ABSTRACT

A bond between a refractory metal or semiconductor and a ductile metal and a method for making the same includes forming a layer of a refractory metal wetting agent such as titanium on the refractory metal before bonding to allow wetting of the refractory metal by the ductile metal.

39 Claims, 6 Drawing Figures

Fig. 3
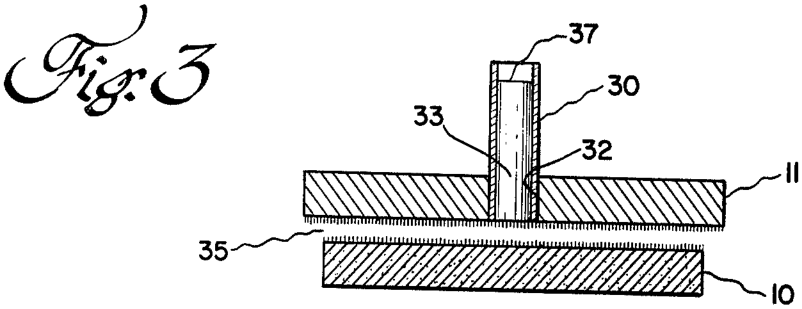
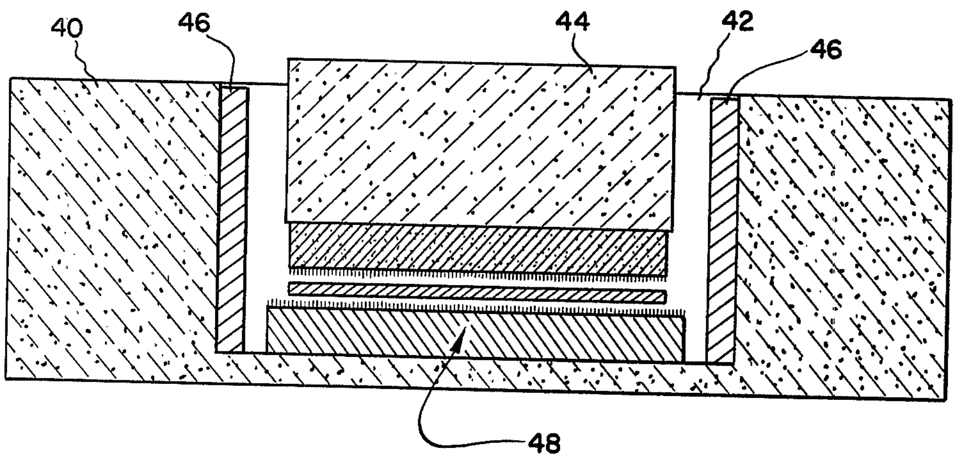
Fig. 4

LEAD BONDING METHOD

This application is a continuation-in-part of Ser. No. 563,821, filed Mar. 31, 1975 for "Lead Bonding Method" and of Ser. No. 697,983, filed June 21, 1976 which is a division of Ser. No. 563,821, both now abandoned.

This invention relates, in general, to a method for bonding a semiconductor wafer to a thermally conductive member, and more particularly, to a method for bonding silicon to a metal using substantially pure lead as a bonding material and titanium or similar refractory metal, such as zirconium, hafnium, etc., as a wetting agent.

The formation of a satisfactory bond between a semiconductor device and a metal support therefor, involves several problems. It is desirable to obtain both a low thermal resistivity and a low electrical resistivity in the bond. Further, where the coefficients of thermal expansion of the silicon and the metal are dissimilar, it is necessary to provide a bond which is not totally rigid, and which therefore provides an interface which will yield rather than applying shear or bending stress to the semiconductor wafer. Similarly, it is desirable to provide a bond which will not be degraded by repetitive thermal cycling as would be expected to occur as the device is heated and cooled. Lead-tin solder compounds are especially susceptible to such recrystallization under repetitive heating and cooling conditions.

It is an object of this invention to provide a method for forming a silicon-to-metal bond which exhibits high thermal and electrical conductivity, which is flexible and not degraded by the effects of unequal coefficients of thermal expansion between silicon and the particular metal utilized.

Briefly stated, and in accordance with one aspect of this invention, a method for bonding a semiconductor to a metal includes the steps of coating the surfaces to be bonded with titanium, or other similar refractory metal; providing a source of substantially pure lead or other suitable bonding material between the surfaces, and heating the bond to a temperature sufficient to first melt the bonding material and second, cause it to wet the surfaces of the semiconductor and the metal.

The features of the invention which are believed to be novel are pointed out with particularity in the appended claims. The invention itself, however, both as to its organization and method of operation together with further objects and advantages thereof may best be understood by reference to the following description taken in connection with the accompanying drawings in which:

FIG. 3 shows an alternative method for the introduction of bonding lead into the structure.

FIG. 4 shows a structure to be utilized in the high temperature stages of the process in accordance with this invention.

Figure 1:
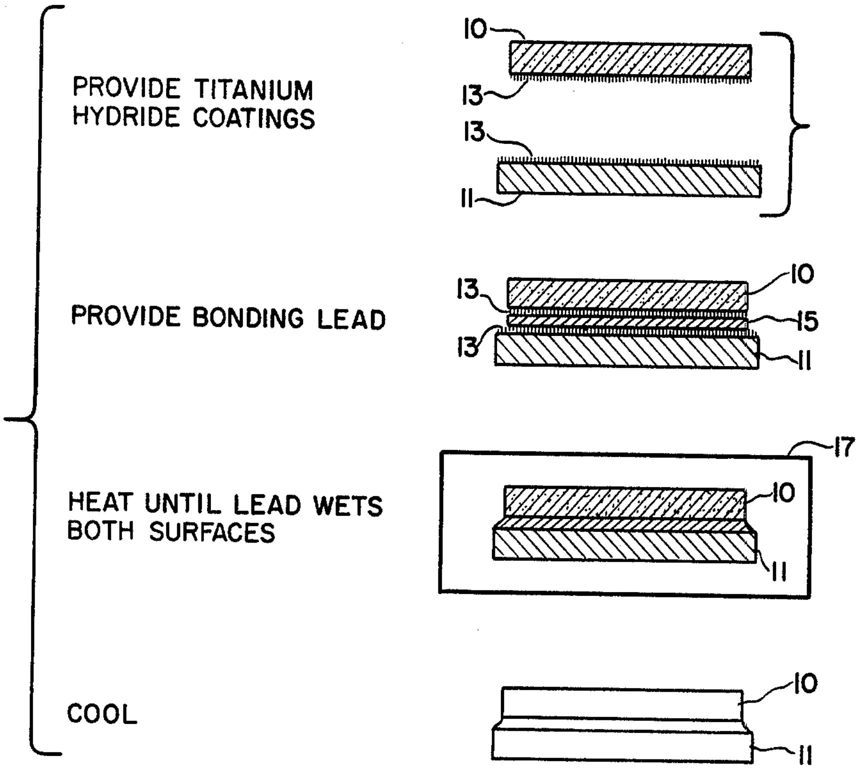
FIG. 1 shows in diagrammatic flow diagram form the steps necessary for the formation of a semiconductor to metal bond in accordance with one aspect of this invention.

Referring now to FIG. 1, there is shown in flow diagram form the steps necessary to create a bond between a semiconductor wafer 10 and a metallic support therefor 11. For purposes of illustration we will assume that the semiconductor wafer is a silicon wafer and that the metal is a refractory metal, as for example, molybdenum. It is to be understood that this invention is not so limited, however, and that other semiconductor materials, as for example, germanium or Group III-V semiconductor materials, such as gallium arsenide, are suitable and similarly that other metals, as for example, tungsten, tantalum and niobium may be used. Also, other refractory metals may be utilized if desired and therefore this invention is not intended to be limited to the specific metals enumerated herein. It is to be further understood that while for purposes of illustrating the practice of this invention lead is chosen as a bonding material, the invention is not limited solely to the use of lead. For example, substantially pure tin, indium or bismuth may be utilized as a substitute for lead. The important characteristics to be considered in choosing a suitable bonding material are the melting point, and the ductility. It is required that the material chosen be solid at the temperature of operation of the device, and, additionally, it is desirable that the melting point be as low as possible, a low melting point being desirable insofar as the residual strain in the joint is directly related to the temperature difference between the ambient temperature and the melting point of the bonding material. It is preferably that the bonding material chosen have a melting point between 150° and 350° C. It is pointed out that cadmium while having an appropriate melting point and ductility is not suitable insofar as it is highly volatile and poisonous.

It is to be further understood that while titanium is referred to as a wetting agent in the exemplary embodiment of this invention described herein, the invention is not so limited, and in fact, other refractory metals are suitable. For example, zirconium and hafnium are also suitable to be used in accordance with this invention.

Before formation of the bond is begun it is necessary to clean the surfaces of the semiconductor and the metal to be bonded. Preferably the surfaces should be as free from grease and/or surface oxides as possible. It has been found that a rinse in an organic solvent such as acetone or methanol followed by an etch including approximately equal amounts of nitric and hydrofluoric acids provides adequate cleaning capability for most semiconductors and metals. No particular method of cleaning is required to practice this invention, however, and any of the well-known methods for cleaning metals and/or semiconductors may be used.

After the surfaces have been prepared as hereinabove described, it is necessary to provide thereon a thin coating of finely dispersed titanium. It has been found that it is convenient to utilize titanium hydride as a titanium source. Dispersed, finely-divided titanium hydride in an amyl acetate carrier together with a nitrocellulose binder, if desired, provides a source of titanium easily applied, as for example by spraying or brushing onto the surfaces of the semiconductor and metal. It is preferred that in accordance with this invention whatever medium is selected to provide the titanium coating yield a layer of approximately 1 to 3 particles thick on each surface. It is emphasized that the carrier and/or the binder are not critical to the invention and merely provide a means for retaining the titanium at the surfaces of the semiconductor and the metal to be bonded. Further, as will be hereinbelow described, substantially pure titanium or a combination of titanium and titanium hydride will provide the necessary function.

Wafers 10 and 11 now having a titanium hydride coating 13 at the surfaces thereof which will form the bond, are placed in a sandwich-like relationship with a source of lead 15 therebetween. The resulting structure includes and semiconductor wafer 10, a thin layer of titanium hydride 13, a sheet of lead 15, a second thin layer of titanium hydride 13 and finally the metal wafer 11. The method for providing the source of lead which will in fact form the bond is not critical insofar as the practice of this invention is concerned. The placing of a thin lead sheet between the metal and the semiconductor to be bonded is exemplary only and, in fact, at least one alternative thereto will be illustrated hereinbelow. Any method for providing the source of lead, as for example those methods herebefore practiced in any of a number of well-known soldering techniques, is acceptable. It is desirable only that a method for providing a source of bonding lead not introduce any tendency to imperfection in the bond. For example, it would obviously be detrimental to provide a source of lead which resulted in trapped gas pockets or an otherwise nonuniform bond.

The sandwich-like structure formed as hereinabove described is now subjected to an increase in temperature in an inert or substantially inert atmosphere. For example, a vacuum chamber 17 may be used to surround the structure while the temperature is raised. Alternately, an inert atmosphere, as for example argon or nitrogen may be utilized to to somewhat reduce the requirements for evacuation. It is to be understood that any method which substantially prevents the formation of oxides during the high temperature portions of the bonding process is suitable for use in accordance with this invention. For example, nitrogen or argon provide an acceptable atmosphere. It is to be understood however that where the inert gas employed includes impurities, as is usually the case, these impurities may degrade the character of the bond formed therein. It is preferable therefore that where an inert gas environment is used that it be of the highest quality. In this evacuated or inert environment the temperature is now increased to a level sufficient to melt the lead and form the bond. As is well known lead melts at a temperature of approximately 327° C. Titanium hydride decomposes at a temperature of approximately 400° C, releasing hydrogen therefrom. Wetting does not occur until the temperature reaches approximately 550° C. It has been found therefore that it is preferable to increase the temperature to approximately 600° C to insure that a satisfactory bond will be formed in all instances. It is preferable in accordance with this invention to apply some pressure to the semiconductor-metal structure during heating to insure the formation of a satisfactory bond therebetween. After wetting of the semiconductor and metal surfaces takes place the structure should be cooled. It has been found that it is desirable that cooling take place fairly rapidly in order to minimize the residual strain in the structure. As is well known, the residual strain increases as the solidification temperature increases, and therefore to the extent that while the structure remains at an elevated temperature lead and silicon may interact, and further since a lead-silicon combination has a higher melting point than that of pure lead, a relatively long cooling time will produce a bond having a higher residual strain than a short cooling time. An additional feature of this invention is that the presence of a titanium film which substantially reduces the interaction between lead and silicon will prevent the melting point of the lead from being raised and will thereby produce a bond having a substantially lower residual strain than was possible heretofore.

Figure 2:
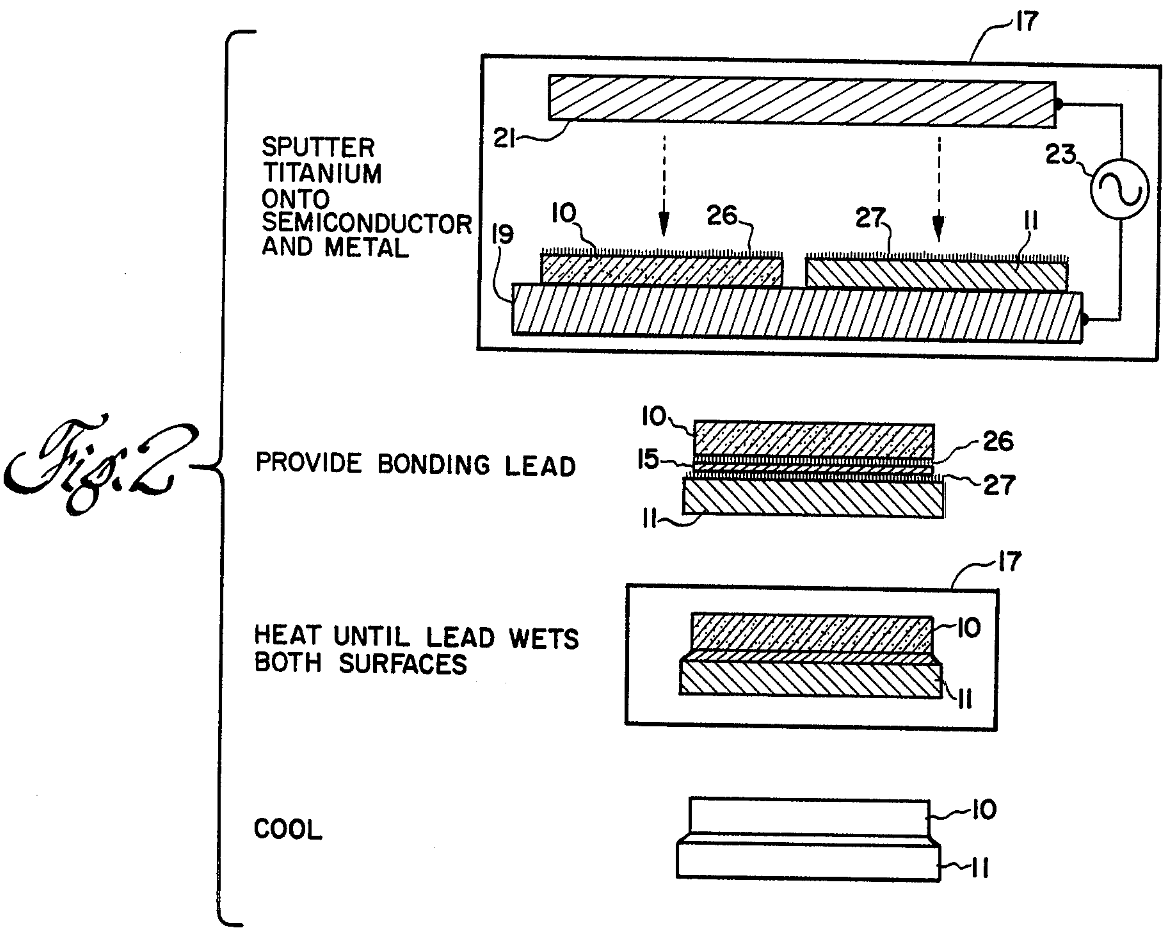
FIG. 2 shows in similar form the steps of another embodiment of this invention.

FIG. 2 illustrates in schematic flow diagram form another method for forming a bond between a semiconductor and a metal in accordance with this invention. As was hereinbefore described in conjunction with FIG. 1, it is necessary before initiating the steps illustrated in FIG. 2 to provide a substantially clean surface on each of the elements to be bonded. This step is assumed to have been performed before the first step illustrated at FIG. 2. After the semiconductor and metal surface to be bonded are clean, a thin layer of titanium is sputtered onto those surfaces. Sputtering is performed in low pressure argon as illustrated herein by vacuum chamber 17 into which semiconductor material 10 and metallic wafer 11 are placed. The two materials are disposed with their nonbonding surfaces in contact with a substantially nonreactive electrode 19 in a manner to provide good electrical contact between each of the semiconductor and metal wafers and the electrodes. A second electrode 21 is provided within the vacuum chamber and a voltage source 23 is connected between the two electrodes. This voltage source is preferably a source of high frequency electrical energy as, for example, a 13.5 Megahertz radio frequency source. Electrode 21 is a titanium electrode which during the sputtering process provides the source of titanium to be deposited on the surfaces of the semiconductor and metal to be bonded. During the sputtering process an inert gas, as for example argon, is introduced into the vacuum chamber which will provide the necessary energetic particles to dislodge minute quantities of titanium from electrode 21 which will be accelerated by voltage source 23 and deposited upon semiconductor and metal wafers 10 and 11. The sputtering process creates thin layers 26 and 27 of titanium on the surfaces to be bonded. It is to be noted that this process provides substantially pure titanium layers rather than the titanium hydride coatings provided in the embodiment of this invention discussed hereinabove in conjunction with FIG. 1.

Both the use of finely dispersed titanium hydride and substantially pure titanium layers on the surfaces to be bonded provide desirable features. For example, particulate titanium hydride provides some cleaning as the hydrogen is released from the titanium hydride during heating. Particulate titanium hydride does not, however, prevent interaction between silicons and lead, but does dissolve oxygen which otherwise would contribute to the formation of oxides at the surfaces to be bonded. Substantially pure titanium substantially prevents interaction between silicon and lead thus resulting in a bond having lower residual strain, but does not provide any hydrogen and therefore lacks the cleaning function of particulate titanium hydride which may be desirable in certain instances. Where the advantages of pure titanium and of titanium hydride are desired, it is preferred in accordance with this invention to provide a thin layer of substantially pure titanium on the surfaces to be bonded and then to expose these layers to a hydrogen atmosphere such that some or all of the substantially pure titanium is changed to titanium hydride. The concentration and length of exposure to the hydrogen atmosphere will determine to what extent the substantially pure titanium layer is changed to titanium hydride. In this way, a uniform layer of titanium hydride or of titanium hydride overlying pure titanium may be formed.

After the titanium layers 26 and 27 have been sputtered onto the surfaces to be bonded a source of lead, as for example, relatively thin lead sheet 15 is interposed between the semiconductor and metal wafers 10 and 11 having titanium layers 26 and 27 on the surfaces thereof. A sandwich-like structure is formed thereby having semiconductor material 10, titanium layer 26, lead sheet 15, titanium layer 27 and metallic wafer 11 in that order.

The sandwich-like structure is now heated in an evacuated or inert environment as hereinabove described in conjunction with FIG. 1 to a temperature of approximately 600°, such temperature being sufficiently high to first melt the lead and then permit the lead to wet the surfaces of the titanium covered semiconductor and metal. It is to be pointed out that the temperature to which the sandwich-like structure must be elevated may vary somewhat from the figure suggested herein depending upon the particular semiconductor and metal utilized. Observation of the heating process will readily indicate when wetting has occurred insofar as the contact angle of the lead with respect to the semiconductor and the metal materials will vary during heating unitl such time as wetting occurs when it will flow onto the surface in a manner similar to that well known in traditional soldering processes. After wetting has occurred, a bonded structure should be cooled as hereinbefore described.

FIG. 3 shows an alternative method for providing bonding lead as required in the processes in accordance with this invention illustrated at FIGS. 1 and 2. It is assumed that the employment of the method for providing bonding lead as illustrated at FIG. 3 follows the application of the titanium or titanium hydride coatings by either of the methods illustrated at FIGS. 1 and 2 or by any other method. A stand pipe 30 is inserted through an orifice 32 in the metal wafer 11. A reservoir 33 of lead is provided inside stand pipe 30. Metallic wafer 11 and semiconductor material 10 are then placed in close proximity one to the other and heated in an inert or evacuated environment as hereinabove described. As the lead in the reservoir 33 melts, lead flows from stand pipe 30 into the space 35 between metallic member 11 and semiconductor 10. This method which may be utilized as hereinbefore described in conjunction with the embodiment of this invention of FIGS. 1 or 2 provides the advantage that the introduction of lead oxide into the gap between the semiconductor and the metal is substantially reduced. It can be seen that as the lead melts and begins to flow from the stand pipe to the space 35 between the semiconductor and the metal, it leaves the lead oxide behind in the stand pipe. In addition, only the top surface 37 of the reservoir of lead is exposed to the environment in which the bond is formed. It will be appreciated therefore that the large surface as would be present where the thin sheet of bonding lead 15 is provided between the semiconductor and the metal, as for example as hereinbefore discussed in conjunction with FIGS. 1 and 2, which surface would be susceptible to the formation of oxides thereon, is eliminated and a superior bond is formed.

FIG. 4 illustrates a method in accordance with this invention for performing the heating step of FIGS. 1 and 2 in an inert atmosphere, such as a conveyor belt furnace. A graphite boat 40 is provided having a well 42 therein of sufficient size to hold the particular semiconductor and metal sandwich-like structure desired to be bonded. The sandwich-like structure is placed at the bottom of the well and a graphite holding member 44 is placed on top thereof to provide a sufficient force to maintain the desired positional relationship between the semiconductor and metal wafers. A thin sheet of titanium 46 lines the inside of well 42 surrounding the sandwich-like structure 48 and graphite block 44. Boat 40 is conveniently heated in an oven which may, if desired, be segmented into compartments whereby the temperature may be precisely controlled in stages. It is an advantage of the structure illustrated at FIG. 4 that where impurities, as for example, mainly oxygen are present in the inert gas or vacuum environment in which the bond is formed, these impurities tend to react first with the graphite to form, for example, volatile carbon dioxide which is carried away by the carrier gas present in the oven and also with the titanium sheet 46 which lines well 42 and which dissolves oxygen. In this way, oxygen is substantially prevented from reaching the bond as it is forming and a superior quality bond results.

The method for bonding a semiconductor to a metal hereinabove described provides a bond of substantially improved characteristics as compared to those hereinbefore obtainable. While several specific techniques have been described for the formation of a bond utilizing substantially pure lead along with titanium in one of a number of forms as a wetting agent, it is to be understood that this invention is not limited to any particular form or process for forming a bond. For example, titanium hydride has been illustrated as one compound for providing a source of titanium during the high temperature portion of the bonding process. As has been pointed out, the process is applicable to a large number of metals hereinbefore enumerated but is not intended to be limited thereto insofar as is known any refractory metal, that is to say, any metal which will not be degraded by the heats necessary to form the bond may be utilized. It is required, of course, that the metal be wetted by the lead in the presence of titanium. Further, it has been found that zirconium hydride is to some degree substitutable for titanium where desired. Titanium, however, is to be preferred in that it produces a superior quality bond. Two specific methods have been described for providing a titanium coating, but the invention is not intended to be limited to any specific method for providing the titanium coating and other methods, as for example evaporation are equally suitable, the precise method chosen being determined by the availability of equipment for performing the necessary processing steps. Whatever method is chosen to provide a titanium or other coating before bonding, it is preferred to obtain a layer from 300A-1 mil in thickness and in no case more than 10 mils. A thickness of 5000 A produces good results.

Figure 5:
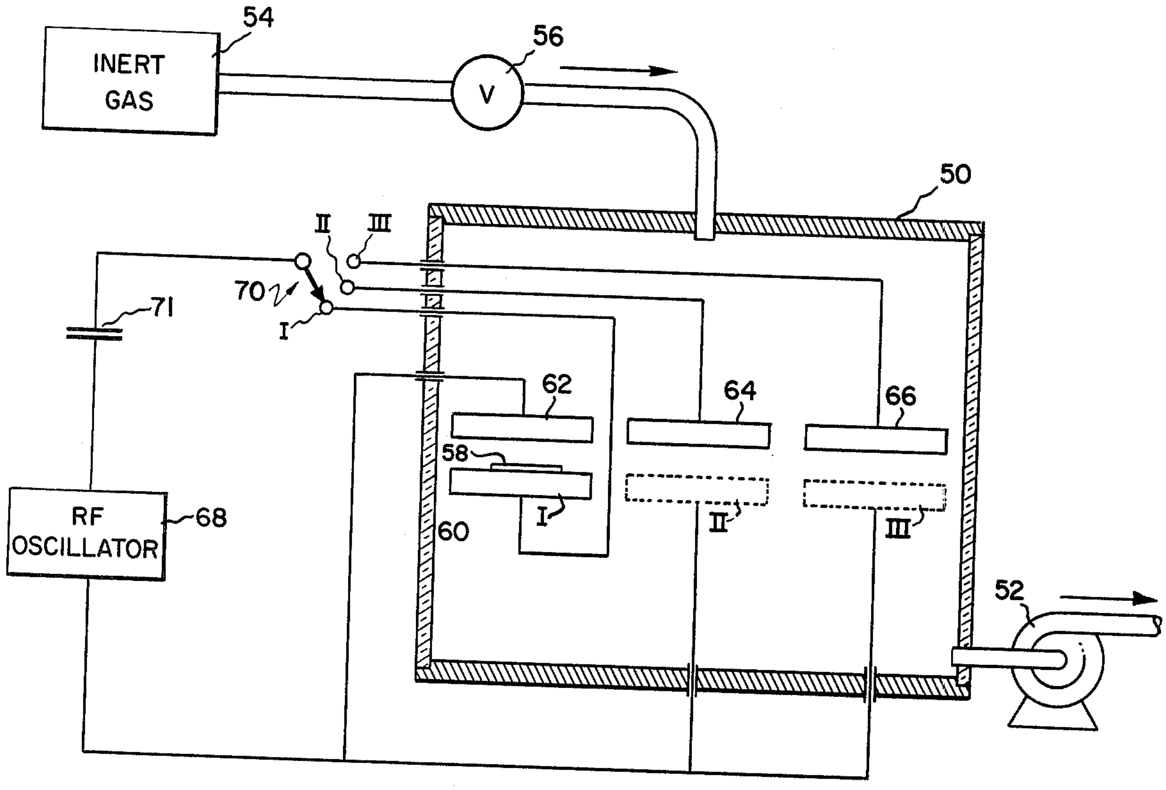
FIG. 5 shows apparatus for the formation of a bond in accordance with a presently preferred embodiment of this invention.

A presently preferred method for providing both semiconductor wafers and metallic members suitable for bonding in accordance with this invention may be most readily understood by referring now to FIG. 5 which illustrates apparatus particularly useful for carrying out the invention. It is often times desirable to prepare either the silicon or metallic members to be bonded sometime before the bonding process is to take place. The method hereinabove described for forming a bond is most suitably employed when the actual bond is to be formed more or less in one operation, that is to say with a minimum delay between the preparation of the members to be bonded and the actual bond. In accordance with this presently preferred embodiment of the invention, the members may be prepared sometime before the actual bond is to be formed and they are relatively stable insofar as the formation of bond degrading oxide or the like on the surface of the members to be bonded.

Figure 6:
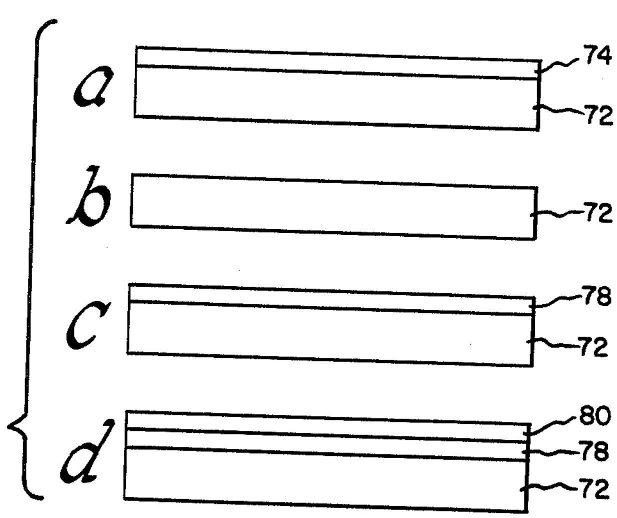
FIG. 6 shows the bonded member in the stages of formation thereof.

Referring specifically to FIG. 5 which illustrates apparatus for forming a bond in accordance with the presently preferred embodiment of this invention at FIG. 6 which illustrates the step-wise preparation of a member to be bonded, FIG. 5 will be recognized to be an RF sputtering device. A chamber 50 is provided having suitable apertures therethrough for the passage of electrical and vacuum connections to the interior of the chamber. The chamber is maintained at a suitable pressure by vacuum pump 52 which operates against a source of inert gas 54 under the control of valve 56. A member to be prepared for bonding 58 is supported on a first electrode 60 which may be selectively located beneath targets 62, 64 and 66. Electrode 60 and targets 62, 64 and 66 are connected to RF oscillator 68 through switch 70 and capacitor 71. Switch 70 selectively connects RF oscillator 68 to the three sputtering locations within chamber 50, that is a first location wherein electrode 60 is adjacent electrode 62, a second location adjacent electrode 64 and a third location adjacent electrode 66. Second and third locations respectively are illustrated in phantom in the drawing.

The invention may be readily understood by considering in some detail an exemplary process in accordance therewith. For purposes of this example, a silicon wafer will be prepared in accordance with this invention. The wafer 58 is introduced into chamber 50 and is physically located on electrode 60 as illustrated. Chamber 50 is sealed and the pressure therein is reduced. Pressures on the order of $10^{-7}$ Torr are suitable in accordance with this invention. Argon is introduced into the chamber through valve 56 which is adjusted to maintain the desired pressure. RF oscillator 68 is energized and switch 70 is adjusted to position I which corresponds to sputtering location I. For convenience, the three sputtering locations are designated I, II and III as are the switch positions. RF energy is supplied between electrodes 60 and 62 in such a way as to cause cleaning of the silicon wafer by the bombardment thereof by argon atoms. FIG. 6 illustrates the condition of the wafer during this phase, the wafer 72 being covered with a layer 74 of oxide, which is typically $SiO_2$. Electrode 62 may conveniently be made of aluminum or other material which functions to collect the material cleaned from the surface of wafer 72 during the cleaning phase. Cleaning may typically be accomplished by the application of 200 watts of RF power for approximately 2 minutes. After cleaning has occurred, the chamber is purged in order to remove any products of the cleaning and additional inert gas is introduced. The purging and introduction of additional gas is done while maintaining a low pressure and without violating the integrity of the chamber. Wafer 58 is moved now to position II adjacent electrode 64 which is conveniently made of titanium or of one of the other wetting agents hereinabove described, for example zirconium and hafnium. Switch 70 is adjusted to position II and oscillator 68 is energized to sputter titanium onto the clean wafer 72 (FIG. *6b*). Typically, the application of a 500 watt RF signal for 12 minutes will provide a satisfactory layer of titanium in accordance with this invention. It is emphasized that the times and RF power levels described herein for purposes of illustration are exemplary it being the object to obtain sputter layers of the desired thicknesses. Typically, a titanium layer of 2500 Angstroms is preferred with the range of approximately 1000 to 5000 Angstroms being acceptable. In certain applications, thicknesses beyond these ranges may be desirable. After a titanium layer 78 has been formed on wafer 72, the wafer is moved to position 3 adjacent electrode 66 which is conveniently a lead electrode, it being understood that tin bismuth and indium as described hereinabove are also suitable along with other bonding materials if desired. Switch 70 selects position III and sputtering occurs, for example, by the application of 150 watts of RF power to the electrodes for 15 minutes. It is desirable to form a layer of between 1000 and 10,000 Angstoms, 5000 Angstroms being a satisfactory nominal value.

In accordance with this invention, even more satisfactory results may often times be obtained by cleaning the target electrodes 64 and 66 prior to the actual sputtering step. This may be readily accomplished by energizing the electrodes outside of the presence of wafer 58 so that the surface oxides are removed.

FIG. *6d* illustrates the finally achieved wafer 72 having a first thin layer 78 and a second layer 80 thereon. The finished wafer is not especially reactive and may, therefore, be stored without degradation for a longer period than a wafer prepared with a coating of titanium alone. It is advantageous in accordance with this invention to store the wafers in a non-reactive atmosphere as for example, nitrogen. They may be stored for a considerable time at room temperature without substantial degradation and may thereafter be utilized as has been described hereinabove to form bonds with metallic or other substrates.

While the invention has been particularly shown and described with reference to several preferred embodiments thereof, it will be understood by those skilled in the art that various changes in form and detail may be made therein without departing from the true spirit and scope of the invention as defined by the appended claims.

What is claimed is:

1. A method for forming a bond between a suitable metal and a semiconductor selected from the group consisting of silicon, germanium and group III-V compounds comprising:

coating the surfaces to be bonded with a substantially uniform layer of refractory metal wetting agent selected from the group consisting of titanium, zirconium and hafnium, providing a source of bonding metal selected from the group consisting of substantially pure lead, tin, bismuth and indium between said coated surfaces, said coated surfaces having a thickness which substantially prevents interaction between said bonding metal and said semiconductor, heating the bonding metal and the surfaces to be bonded to a temperature sufficiently high to cause melting of the bonding metal and wetting of the surfaces by the bonding metal in the presence of the refractory metal wetting agent, whereby a bond is formed having a low melting point and low residual strain.

2. The method of claim 1 wherein coating said surfaces to be bonded with a layer of refractory metal wetting agent comprises coating said surfaces with finely divided refractory metal having a thickness between approximately 300 angstroms and 1 mil.

3. The method of claim 2 wherein coating said surfaces to be bonded with a layer of refractory metal wetting agent comprises sputtering said refractory metal onto said surfaces.

4. The method of claim 2 wherein coating said surfaces with a refractory metal wetting agent comprises evaporating said metal onto said surface.

5. The method of claim 1 wherein providing a source of substantially pure bonding metal comprises disposing a thin sheet of bonding metal between said surfaces.

6. The method of claim 1 wherein providing a source of substantially pure bonding metal comprises inserting a metal filled stand pipe through one of said surfaces so that upon melting, said metal will flow between said surfaces.

7. The method of claim 1 wherein said heating step comprises heating to a temperature in excess of 550° C.

8. The method of claim 1 wherein said heating step comprises heating to a temperature between 500° and 700° C.

9. The method of claim 1 wherein said heating step includes placing said refractory metal coated semiconductor and metal along with said bonding metal into a graphite boat and heating said boat.

10. The method of claim 1 wherein said suitable metal is chosen from the group consisting of tungsten, molybdenum, tantalum, and niobium.

11. The method of claim 1 wherein said heating step comprises heating in a vacuum.

12. The method of claim 1 wherein said heating step comprises heating in an inert gas.

13. A method for forming a lead bond between a suitable metal and a semiconductor selected from the group consisting of silicon, germanium and group III-V compounds comprising:

coating the surfaces to be bonded with a layer of approximately 300 Angstroms to 10 mils thickness from a source of titanium;

providing a source of substantially pure lead between said titanium coated surfaces; and heating the lead and the surfaces to be bonded to a temperature sufficiently high to cause melting of the lead and wetting of the surfaces by the lead in the presence of the titanium, the thickness of said source of titanium layer substantially preventing interaction between said semiconductor and said lead thereby producing a bond having low residual strain.

14. The method for forming a bond of claim 13 wherein coating said surfaces to be bonded with a layer of a source of titanium comprises coating said surfaces with finely divided titanium hydride.

15. The method of claim 14 wherein said finely divided titanium hydride is carried by amyl acetate.

16. The method of claim 15 wherein said finely divided titanium further includes a nitro-cellulose binder.

17. The method of claim 13 wherein coating said surfaces with a layer of titanium comprises sputtering said titanium onto said surfaces to a thickness in excess of 300 A.

18. The method of claim 13 wherein coating said surfaces with titanium comprises evaporating titanium onto said surfaces to a thickness in excess of 300 A.

19. The method of claim 13 wherein providing a source of lead comprises disposing a thin sheet of lead between said surfaces.

20. The method of claim 13 wherein providing a source of lead comprises inserting a lead filled stand pipe through one of said surfaces so that upon melting, said lead will flow between said surfaces.

21. The method of claim 13 wherein said heating step comprises heating to a temperature in excess of 550° Centigrade.

22. The method of claim 13 wherein said heating step comprises heating to a temperature between 500° and 700° Centigrade.

23. The method of claim 13 wherein said heating step includes placing said titanium coated semiconductor and metal along with said lead in a graphite boat and heating the boat.

24. The method of claim 13 wherein said semiconductor is silicon.

25. The method of claim 13 wherein said suitable metal is chosen from the group comprising tungsten, molybdenum, tantalum and niobium.

26. The method of claim 13 wherein said heating step comprises heating in a vacuum.

27. The method of claim 13 wherein said heating step comprises heating in an inert gas.

28. The method of claim 13 wherein coating said surfaces to be bonded with a thin layer of a source of titanium comprises coating said surfaces with a layer of titanium hydride overlying a layer of substantially pure titanium.

29. The method of claim 28 wherein coating the surfaces to be bonded with a thin layer of titanium hydride overlying a layer of substantially pure titanium comprises coating said surfaces with a layer of substantially pure titanium; and exposing the titanium surfaces to a hydrogen atmosphere so that at least some of said substantially pure titanium is converted to titanium hydride.

30. A method for forming a bond between a suitable metal and a semiconductor selected from the group consisting of silicon, germanium and group III-V compounds comprising:

coating the surfaces to be bonded with a layer of between 1000 and 10,000 Angstroms of a refractory metal wetting agent selected from the group consisting of a source of titanium, zirconium and hafnium;

coating said coated surfaces with a further layer of bonding metal selected from the group consisting of substantially pure lead, tin, bismuth and indium;

heating the bonding metal and the surfaces to be bonded to a temperature sufficiently high to cause melting of the bonding metal and wetting of the surfaces by the bonding metal in the presence of the refractory metal wetting agent; and rapidly cooling the resulting structure to minimize residual strain in the structure.

31. The method of claim 30 wherein said coating steps are performed by sputtering in an inert atmosphere.

32. The method of claim 30 wherein coating said surfaces with said further layer of bonding metal comprises sputtering said bonding metal onto said surfaces.

33. The method of claim 32 wherein sputtering said bonding metal onto said surfaces comprises sputtering a layer of bonding metal having a thickness between approximately 1000 and 10,000 Angstrom onto said surface.

34. The method of claim 30 wherein coating said surfaces with a layer of refractory metal wetting agent comprises sputtering said wetting agent onto said surfaces.

35. The method of claim 34 wherein coating said surfaces with said further layer of bonding metal comprises sputtering said bonding metal onto said surfaces.

36. The method of claim 35 wherein said sputtering is performed in an inert atmosphere.

37. The method of claim 36 wherein said inert atmosphere comprises argon.

38. The method of claim 34 wherein sputtering said wetting agent onto said surfaces comprises sputtering a layer having a thickness of between approximately 1000 and 5000 Angstroms.

39. The method of claim 38 wherein sputtering said bonding metal onto said surfaces comprises sputtering a layer of bonding metal having a thickness between approximately 1000 and 10,000 Angstrom onto said surface.

* * * * *